United States Patent [19]

Ryan et al.

[11] Patent Number: 5,776,537
[45] Date of Patent: Jul. 7, 1998

[54] METHOD OF CHARACTERIZING EXCHANGE COUPLING FOR MAGNETORESISTIVE SENSOR

[75] Inventors: Patrick J. Ryan, St. Paul; Zhijun Yang, Eden Prairie; Greg S. Mowry, Burnsville, all of Minn.

[73] Assignee: Seagate Technology, Inc., Scotts Valley, Calif.

[21] Appl. No.: 794,421

[22] Filed: Feb. 5, 1997

[51] Int. Cl.$^6$ .......................................... B05D 5/12
[52] U.S. Cl. .................. 427/8; 427/130; 427/131; 427/132; 427/259; 427/264; 427/270; 427/272; 427/282; 427/404; 427/548; 427/599
[58] Field of Search .................. 427/8, 127–132, 427/404, 548, 599, 259, 264, 270, 272, 282

[56] References Cited

PUBLICATIONS

Ching Tsang, "Magnetics of Small Magnetoresistive Sensors", *J. Appl. Phys.*, 55(6), 15 Mar. 1984, pp. 2226–2231.

Yimin Guo and Jian–Gang Zhu, "Study of SAL–Biased MR Head with Patterned Permanent Magnet Bias", *IEEE Trans. Magn.*, vol. 30, No. 6, Nov. 1994, pp. 3861–3863.

Simon H. Liao, Terry Torng, Toshio Kobayahsi, "Stability and Biasing Characteristics of a Permanent Magnet Biased SAL/MR Device", *IEEE Trans. Magn.*, vol. 30, No. 6, Nov. 1994, pp. 3855–3857.

M.S. Miller, A.E. Shultz, Y.M. Chow and L.A. Heuer, "Optimization of Co–Pt and Co–Cr–Pt–Ta Thin Films for Use in Magnetic Data Storage Devices", *Surface and Coatings Techn.*, (1994), pp. 1–6. (No month avail.).

J.A. Aboaf, S.R. Herd and E. Klokholm, "Magnetic Properties of Cobalt–Platinum Thin Films", *IEEE Trans. Magn.*, vol. Mag–19, No. 4, Jul. 1983, pp. 1514–1519.

Tsann Lin, "Magnetic Recording and Structural Characteristics of Sputtered Co–Cr–Pt Films for Longitudinal Recording", *J. Magn. and Magn. Mat.*, 86 (1990), pp. 159–168. (No month avail.).

K. Ounadjela and G. Suran, "Exchange Coupling Between a Soft and Hard Ferromagnetic Thin Film", *J. Appl. Phys.* 63(8), 15 Apr. 1988, pp. 3244–3246.

*Primary Examiner*—Bernard Pianalto
*Attorney, Agent, or Firm*—Kinney & Lange, P.A

[57] ABSTRACT

An MR sensor includes an MR layer and permanent magnets defining an active area on the MR layer. A bi-layer test structure is fabricated with a permanent magnet layer deposited on a substrate and an MR layer deposited on the permanent magnet layer. If desired, a SAL may be deposited prior to deposition of the permanent magnet layer. A DC magnetic field is applied to the bi-layer test structure, and the strength of the DC magnetic field is varied. During application of the DC magnetic field, the magnetic response of the bi-layer test structure is measured to determine a hysteresis loop of the bi-layer structure. The exchange coupling between the permanent magnet layer and the MR layer is characterized by a point of inflection identified on the measured hysteresis loop.

21 Claims, 8 Drawing Sheets

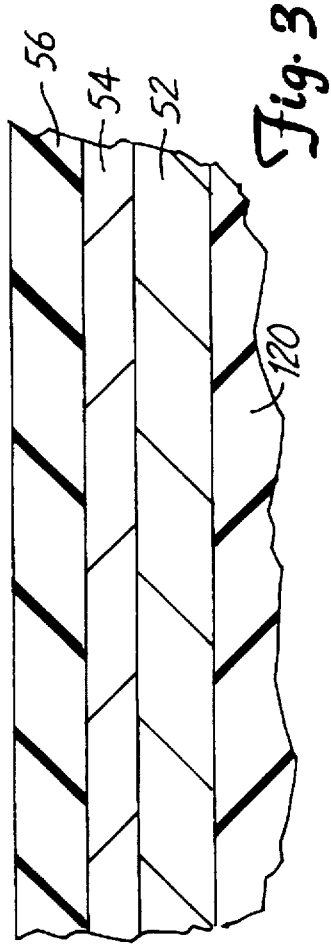
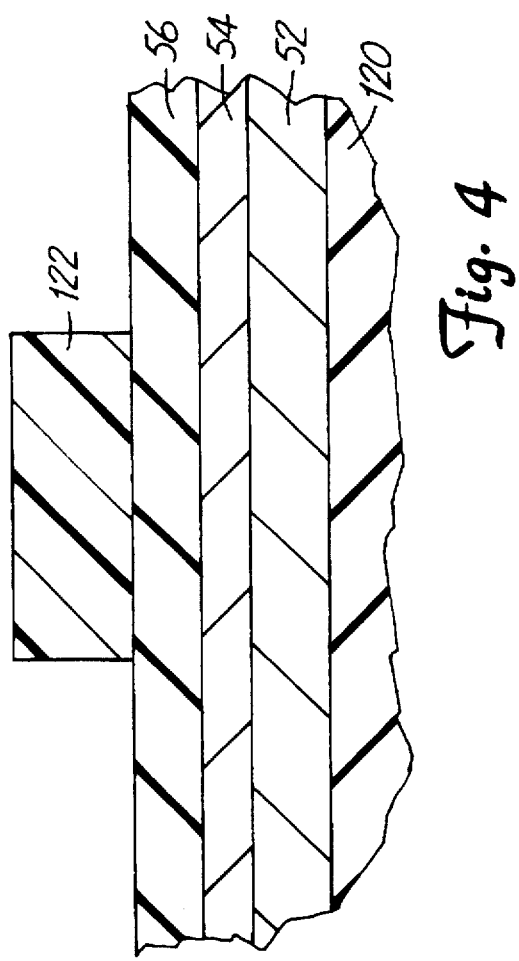

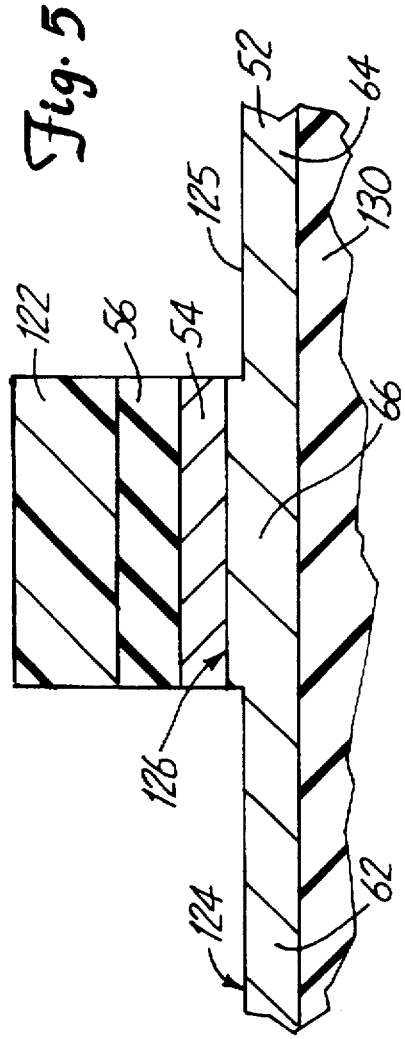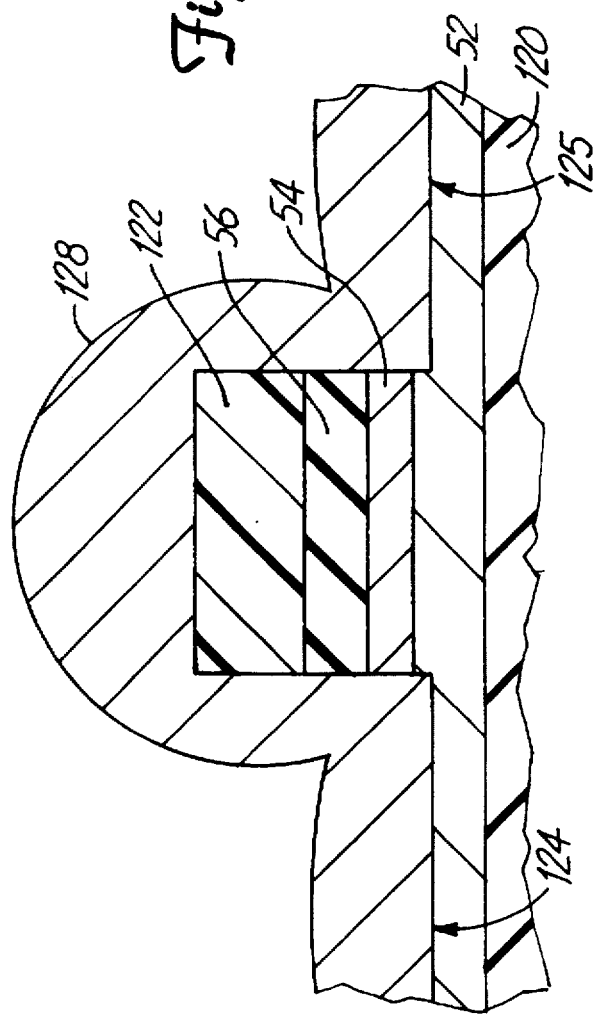

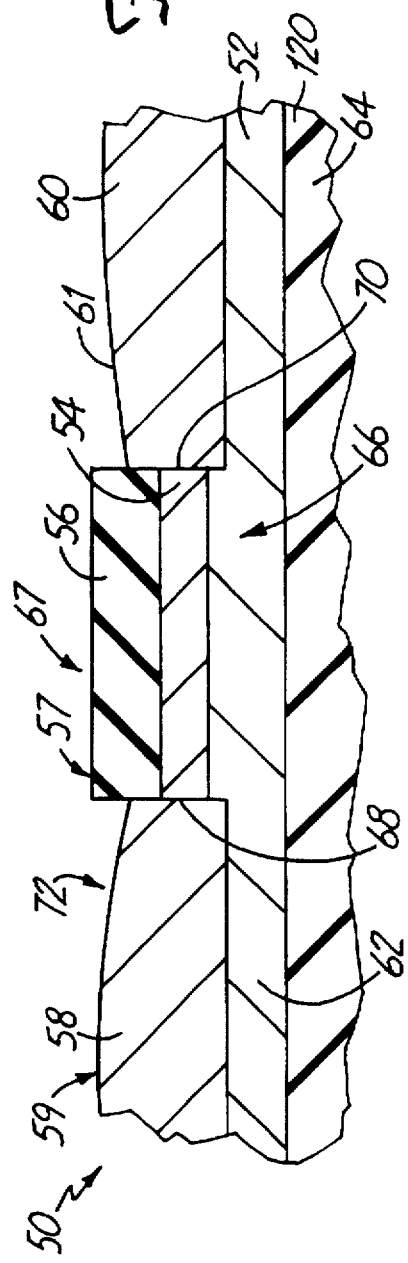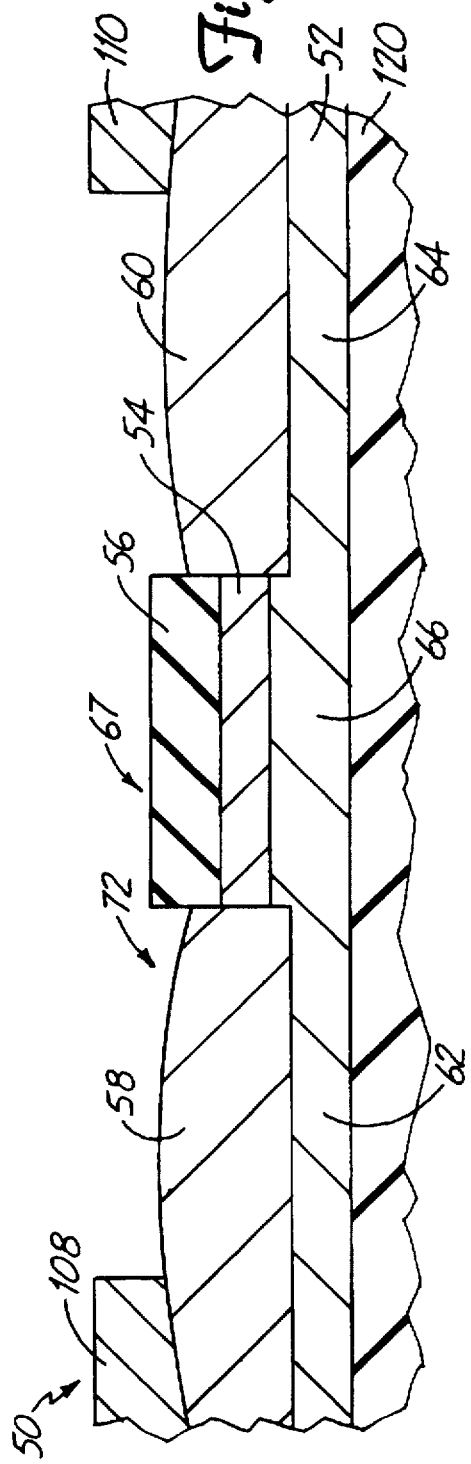

METHOD OF CHARACTERIZING EXCHANGE COUPLING FOR MAGNETORESISTIVE SENSOR

BACKGROUND OF THE INVENTION

The present invention is pertains to the design and fabrication of magneto-resistive sensors, and, more particularly, to a method of characterizing exchange coupling between a permanent magnet layer and a magnetoresistive layer toward optimizing the design and performance of a magnetoresistive (MR) sensor.

MR sensors or heads are used to read magnetically encoded information from a magnetic medium by detecting magnetic flux stored in the magnetic medium. During the operation of an MR sensor, a sense current is passed through the MR element of the sensor, causing a voltage drop. The magnitude of the voltage drop is a function of the resistance of the MR element. The resistance of the MR element varies in the presence of a magnetic field. Therefore, as the magnitude of the flux from a transition in a magnetic layer on a disc passing through the MR element varies, the voltage across the MR element also varies. Differences in the magnitude of the magnetic flux entering the MR sensor can be detected by monitoring the voltage across the MR element.

The amount of voltage change across MR element per change in magnetic flux is dependent upon the angular relationship between the direction of magnetization (magnetization vector M) of the MR element and the direction of electric current (current density vector J) flowing through the MR element. An MR sensor will provide an approximately linear output when these two vectors form an angle of near 45 degrees. An approximately linear output is necessary to achieve optimum sensitivity and minimum readback signal distortion.

Permalloy is an alloy of nickel and iron which is typically used as an MR material. When Permalloy is formed into a long narrow strip such as to be used in the active region of an MR sensor, it naturally tends to form a magnetization vector along its long axis. This alignment can be enhanced by a field induced anisotropy formed during the deposition of the permalloy element. The current density vector is also typically oriented along the long axis of the MR element, in this same direction as the natural alignment of the magnetization vector.

Several techniques can be used to increase the angle between the magnetization vector and the current density vector. By forming a soft adjacent layer (SAL) near the MR element and in a parallel plane to the MR element, the magnetization vector can be rotated at 45 degrees with respect to the long axis. Therefore, if the current density vector points in the same direction as the magnetization vector pointed prior to rotation, the addition of a proper SAL will cause the output of the sensor to be nearly linearly related to the magnitude of the magnetic flux entering the MR element.

MR elements can "fracture" into multiple magnetic domains when they are exposed to an external magnetic field, creating so called "Barkhausen-noise" in the resultant output from the MR sensor. To maximize the MR sensor's output and stability, it is desirable to maintain the MR element in a single domain state, known as boundary control stabilization.

Two methods for stabilizing an MR element in a single domain state are hard biasing and exchange coupling. Hard biasing is accomplished by positioning a permanent magnet adjacent to the active area of the MR element. The stray magnetic field from the permanent magnet located adjacent to the active area helps to boundary control stabilize the active area of the MR element.

The second method of using permanent magnets to boundary control stabilize the active area is to ferromagnetically exchange couple the permanent magnets to the MR layer adjacent to the active area. Depending on the shape of the permanent magnets, the permanent magnets can be deposited such that the magnetic lattice of the permanent magnets exchange couples with the magnetic lattice of the MR element layer at the interface between the permanent magnets and the MR layer. Both hard biasing and exchange coupling can be used together, but in a shielded MR structure, the stray magnetic field from the permanent magnets is largely carried through the highly magnetically permeable shields, and the hard biasing contributes only slightly to boundary control stabilization. The effectiveness of the boundary control stabilization is primarily determined by the ferromagnetic exchange coupling that exists at the permanent magnet—MR element interface. With both hard biasing and exchange coupling, the magnetic field of the permanent magnets should be large enough to ensure a single-domain configuration, yet small enough so as not to change the linearity and signal amplitude of the resultant MR signal.

Much is known about how to optimize the magnetostatic stray field from the permanent magnets. However, little is known about how to optimize or characterize the ferromagnetic exchange coupling that exists at the permanent magnet—MR element interface. New methods are needed to optimize and characterize the ferromagnetic exchange coupling that exists at the permanent magnet—MR element interface.

SUMMARY OF THE INVENTION

The present invention is a method of characterizing exchange coupling between a permanent magnet layer and a magnetoresistive layer toward optimizing the design and performance of a magnetoresistive (MR) sensor. First, one or more bi-layer test structures are fabricated. Each test structure includes a magnetoresistive layer deposited on a substrate and a permanent magnet layer deposited on the permanent magnet layer. A DC magnetic field is applied to the bi-layer test structure, and the strength of the DC magnetic field is varied. During application of the DC magnetic field, the magnetic response of the bi-layer test structure is measured to determine a hysteresis loop of the bi-layer structure. The exchange coupling between the permanent magnet layer and the magnetoresistive layer is characterized by a point of inflection identified on the measured hysteresis loop.

BRIEF DESCRIPTION OF THE DRAWINGS

FIGS. 3–8 are cross-sectional views showing a method of forming the MR sensor of FIG. 1.

DETAILED DESCRIPTION OF THE PREFERRED EMBODIMENTS

The present invention is a method of characterizing exchange coupling between a permanent magnet layer and a magnetoresistive layer toward optimizing the design and performance of an MR sensor. The design and manufacture of MR sensors is generally described in the prior art, and several of these designs have a permanent magnet layer deposited immediately adjacent a magnetoresistive layer. For instance, designs of such MR sensors for which the present invention is particularly useful are described in U.S. Pat. Nos. 5,495,378 and 5,554,265, assigned to the assignee of the present invention and incorporated herein by reference.

Figure 1:
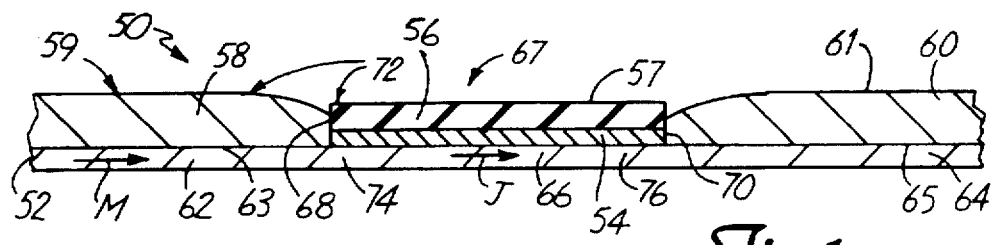
FIG. 1 is a sectional view of a first MR sensor configuration as a preferred embodiment for use with the present invention.

FIG. 1 is a sectional view of such a magnetoresistive (MR) head or sensor 50. The sectional view shown in FIG. 1 is taken from a plane parallel to the air bearing surface of the sensor. In other words, the air bearing surface of MR sensor 50 is parallel to the plane of the page. MR sensor 50 includes MR layer or element 52, spacer layer 54, soft adjacent layer (SAL) 56, and first and second permanent magnets or permanent magnet layer regions 58 and 60.

MR element 52 includes first outer region 62, second outer region 64, and active or central region 66 which is positioned between outer regions 62 and 64. Permanent magnet region 58 has a first surface 59 and is positioned at least partially on top of first MR element outer region 62, such that a first interface 63 exists between permanent magnet region 58 and first MR element outer region 62. Permanent magnet region 60 has a first surface 61 and is positioned at least partially on top of second MR element outer region 64, such that a second interface 65 exists between permanent magnet region 60 and second MR element outer region 64. Gap region 67 is formed above MR element active region 66 and between permanent magnet regions 58 and 60.

Spacer layer 54 is positioned between permanent magnet regions 58 and 60 and on top of active region 66 of MR element 52. SAL 56 is positioned on top of spacer layer 54 such that SAL 56 is also at least partially located between permanent magnet regions 58 and 60. An active region 67 of MR sensor 50 includes active region 66 of MR element 52, spacer layer 54, and at least portions of SAL 56. Permanent magnet regions 58 and 60 act as boundaries of active region 67 and make contact with spacer layer 54 and SAL 56 at junctions 68 and 70. Permanent magnet regions 58 and 60 also help to define active region 66 of MR element 52.

MR element 52 is, in preferred embodiments, a layer of permalloy. Permalloy is a name commonly used to identify any of a large number of highly magnetically permeable alloys containing a combination of nickel Ni and iron Fe. It must be noted that other magnetoresistive materials can be used instead of permalloy. In preferred embodiments, the resistivity of MR element 52 is between 20 and 35 $\mu\Omega$-cm. MR element 52 preferably has a thickness of between 150 and 500 angstroms (Å).

First and second permanent magnet regions 58 and 60 are preferably formed from a layer of high coercivity cobalt-platinum (CoPt). However, other ferromagnetic materials can be used instead of CoPt. The resistivity of permanent magnet regions 58 and 60 is preferably between 30 and 60 $\mu\Omega$-cm. In preferred embodiments, the thickness of permanent magnet regions 58 and 60 is between 200 and 700 angstroms (Å).

Spacer layer 54 is a non-magnetic layer of high resistivity material which is positioned between SAL 56 and active region 66 to prevent magnetic exchange coupling between these two layers. The resistivity of spacer layer 54 is preferably substantially higher than that of MR element 52 so that it does not shunt current away from active region 66 of MR element 52. In preferred embodiments, spacer layer 54 is a layer of tantalum Ta having a resistivity of at least 200 $\mu\Omega$-cm and a thickness of between 50 and 200 angstroms (Å).

SAL 56 is preferably a layer of ferromagnetic material such as nickel-iron-rhodium NiFeRh, nickel-iron-rhenium NiFeRe, or nickel-iron-chromium NiFeCr. The resistivity of SAL 56 is preferably at least 100 $\mu\Omega$-cm to reduce the shunting of current away from active region 66 of MR element 52. SAL 56 has a preferred thickness of between 100 and 400 angstroms.

First outer region 62 of MR element 52 is inhibited from magnetic rotation by first high coercivity, low permeability permanent magnet region 58. Second outer region 64 of MR element 52 is inhibited from magnetic rotation by second permanent magnet region 60. Therefore, very little magnetic flux is absorbed into outer regions 62 and 64. This in turn helps to provide a well-defined reader track width. There is no permanent magnet region above active region 66 of MR element 52, therefore, that region is not inhibited from magnetic rotation.

MR element 52 will naturally tend to form magnetization vector M along its long axis when it is formed. For purposes of explanation, it will be assumed that natural magnetization vector M of active region 66 points from left to right in the plane of the page. Current density vector J is formed in MR element 52 as current passes through MR sensor 50 during its operation. It is assumed that current flows through MR sensor 50, and thus through MR element 52, from left to right in the plane of the page. Therefore, current density vector J in active region 66 points in the same direction as natural magnetization vector M in this example.

The resistance of MR element 52 will vary nearly linearly with the magnitude of magnetic flux entering MR element 52 when magnetization vector M and current density vector J form an angle of approximately 45 degrees. Thus, to achieve a nearly linear response from MR sensor 50, natural magnetization vector M of MR element 52 is rotated by forming SAL 56 above active region 66. The magnetic field of SAL 56 causes natural magnetization vector M of MR element 52 to be rotated approximately 45 degrees with respect to the direction of current density vector J.

Several advantages are obtained by placing permanent magnetic regions 58 and 60 on top of or in a plane above MR element outer regions 62 and 64, rather than on the sides of MR element 52 as is the case in prior art MR sensor designs. In particular, very little magnetic flux is absorbed into first outer region 62 and second outer region 64 or MR sensor 50 because these regions are hard biased or inhibited from magnetic rotation by exchange coupled permanent magnet regions 58 and 60. This design provides a well defined active region 66 of MR element 52, which results in a well defined reader track width. A well-defined reader track width provides the advantages of improved side reading and a good read profile.

Another advantage of placing permanent magnet regions 58 and 60 over MR element outer regions 62 and 64 is that MR element 52 helps to establish the proper magnetic orientation of permanent magnet regions 58 and 60 while the permanent magnet layer is deposited on top of the previously deposited MR layer. This aspect of the present invention is described in detail in co-pending PCT patent application Ser. No. PCT/U.S.94/07064 and in the corresponding U.S. National Phase patent application Ser. No. 08/302,799 entitled SINGLE DOMAIN MR SENSORS USING PERMANENT MAGNET STABILIZATION, assigned to the assignee of the present invention and incorporated herein by reference.

Figure 2:
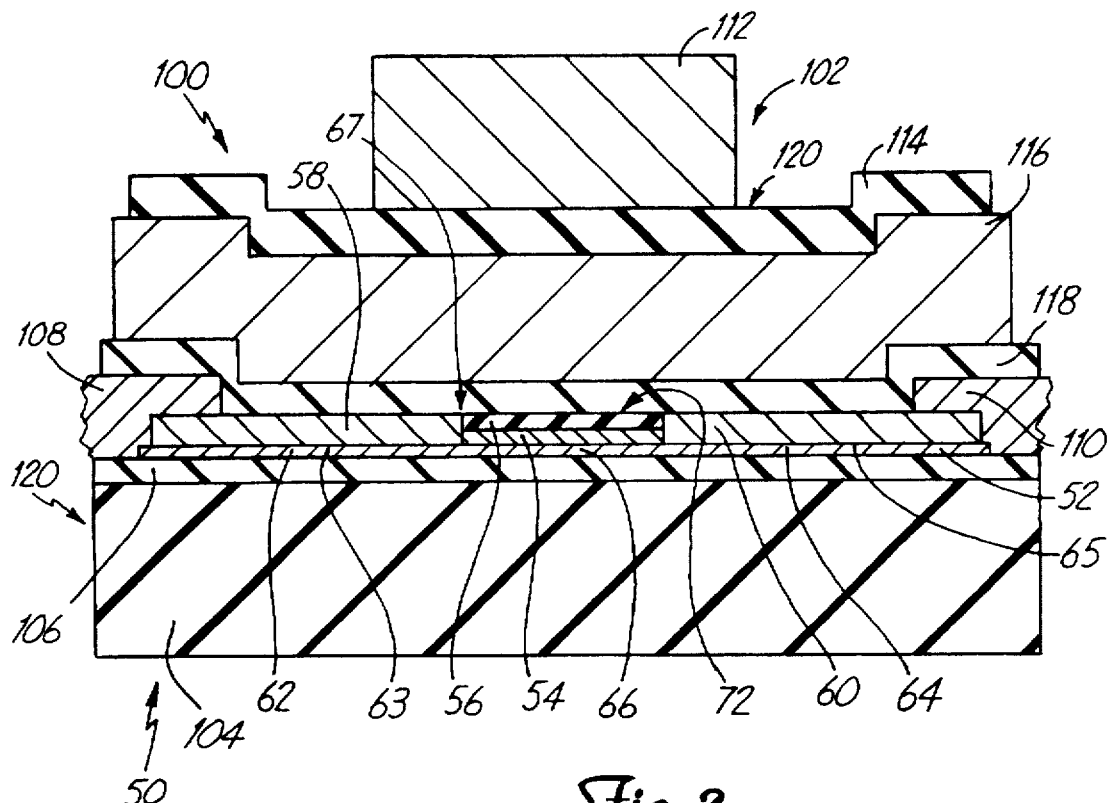
FIG. 2 is a sectional view of a first magnetic device having an inductive write head fabricated on top of an MR sensor for use with the present invention.

FIG. 2 illustrates one embodiment of a magnetic head or device which has an inductive write head or transducer fabricated on top of substantially planar surface 72 of MR sensor 50. FIG. 2 is a sectional view of magnetic device 100 which includes inductive write head 102 and MR read sensor 50. MR sensor 50 is substantially the same as described with reference to FIG. 1. MR sensor 50 is shown fabricated on top of shield layer 104 and insulating layer 106. Conductors or contacts 108 and 110 have been added to MR sensor 50 for connecting MR sensor 50 to bond pads and external circuitry. Write head 102 includes top pole layer 112, write gap layer 114, shared pole layer 116, and insulating layer 118. Layers 106 and 118 are referred to as reader "half-gaps."

As can be seen in FIG. 2, conductors 108 and 110 are positioned on top of permanent magnet regions 58 and 60, MR element outer regions 62 and 64, and layer 106. Conductors 108 and 110 are regions of a conductor layer which is typically between 1000 Å and 3000 Å thick. An important advantage of the design of MR head 50 of the present invention is that placement of conductors 108 and 110 away from the active region or central portion of MR sensor 50 allows the sensor to maintain substantially planar surface 72 on which layer 118 and subsequent layers of write head 102 can be deposited. Because permanent magnet regions 58 and 60 help to define active region 66 of MR element 52, conductors 108 and 110 need not be deposited near the central portion of MR sensor 50.

Shield layer 104 is made from a highly magnetically permeable material. The exact magnetic permeability of shield layer 104 depends upon a number of parameters, including the material of shield layer 104, the deposition parameters for shield layer 104, and the post-deposition processing of shield layer 104, if any. Because of the location of shield layer 104 and the high magnetic permeability of shield layer 104, the stray magnetic field from first and second permanent magnets 58 and 60 is largely carried through shield layer 104. Accordingly, the hard biasing from first and second permanent magnets 58 and 60 contributes only slightly to boundary control stabilization of active area 66. The effectiveness of the boundary control stabilization is primarily determined by the ferromagnetic exchange coupling that exists at first interface 63 and second interface 65 between the permanent magnets 58,60 and the MR element 52.

The amount and effectiveness of exchange coupling that exists at first interface 63 and second interface 65 between the permanent magnets 58,60 and the MR element 52 is difficult to predict, and depends upon a number of fabrication parameters. For instance, the material of the MR element 52, the material of the permanent magnets 58, 60, the thickness of the MR element 52, the thickness of the permanent magnets 58, 60, and the ratio between the thickness of the MR element 52 and the thickness of the permanent magnets 58, 60, all contribute to the amount and effectiveness of exchange coupling which occurs between the permanent magnets 58,60 and the MR element 52. The deposition parameters for the fabrication of MR element 52 and permanent magnets 58, 60, such as the heater power or sputter temperature, the target bias, the gas flow or sputter pressure, and the sputter power, and the sputter duration may all contribute to the amount and effectiveness of exchange coupling. Post-deposition fabrication parameters, such as the type and amount of ion-milling or sputter etching of MR element 52 and related surface conditions of MR element 52, as well as the duration and temperature of annealing of the sensor 50, also contribute to the amount of exchange coupling which occurs between the permanent magnets 58,60 and the MR element 52. With both hard biasing and exchange coupling, the magnetic field of the permanent magnets should be large enough to ensure a single-domain configuration, yet small enough so as not to change the linearity and signal amplitude of the resultant MR signal.

FIGS. 3-8 illustrate a preferred process of forming MR sensor 50 according to the present invention. The cross-sectional views of FIGS. 3-8 are taken from a plane parallel to the air bearing surface of the sensor. In other words, as is the case with FIG. 1, the air bearing surface of MR sensor 50 is in a plane parallel to the plane of the page.

To construct MR sensor 50 as shown in FIG. 1, MR element layer 52 of FIG. 3 is deposited on a substrate 120. As shown in FIG. 2, substrate 120 may be a non-transducing or an insulating layer 106 on shield layer 104 which is in turn on a hard wafer. After deposition of MR element 52, spacer layer 54 is deposited on top of MR element layer 52. Next, SAL 56 is deposited on top of spacer layer 54. SAL 56, spacer layer 54 and MR element 52 are frequently referred to as the "tri-layer". After deposition of the tri-layer, photoresist 122 is patterned on top of SAL 56 to define what will eventually be the active region of MR element 52 and to define what will eventually be the gap region above the active region. Permanent magnet material will eventually be applied to the areas not covered by photoresist 122, and the central region of MR sensor 50 covered by photoresist 122 will become the active region.

In FIG. 5, the structure has been subjected to various processes for removing portions of spacer layer 54 and SAL 56 which are not covered by photoresist 122. First, SAL 56 is subjected to an ion-milling process to remove those portions of SAL 56 not covered by photoresist 122. Next, spacer layer 54 is subjected to a reactive ion-etch process to remove those portions of spacer layer 54 not covered by photoresist 122. Finally, MR element outer regions 62 and 64 are sputter-etched to remove approximately 30 Å of the MR element layer in order to establish a clean surface for later deposition of the permanent magnet layer. Because active region 66 of MR element 52 is protected by photoresist 122, as well as by SAL 56 and spacer layer 54, surface 126 of the active region is not sputter-etched and therefore, will be slightly higher than surfaces 124 and 125 of outer regions 62 and 64.

In FIG. 6, permanent magnet layer 128 has been sputter-deposited over the entire structure. Layer 128 is preferably a layer of CoPt, but any permanent magnet material with in-plane magnetization and high coercivity may be used. After permanent magnet layer 128 is deposited over the entire structure, photoresist 122 is removed with a "lift-off"

process. Typically, a solvent such as acetone is applied to the structure. The solvent penetrates small cracks in permanent magnet 128 and dissolves photoresist 122 out from under layer 128. Once photoresist layer 122 is removed, the portions of layer 128 that are not supported from underneath are broken off during the "lift-off" process, as shown in FIG. 7. Therefore, after removing photoresist 122, only permanent magnet regions 58 and 60 remain.

Annealing of the permanent magnet regions 58 and 60 over the first outer region 62 and the second outer region 64 can change the interface conditions at interfaces 63, 65. The interface conditions are believed to change due to interfacial diffusion or mixing between the materials of permanent magnet regions 58, 60 and MR layer 52. Annealing can be performed at any time after deposition of permanent magnet layer 128, and is preferably performed at 140° C. for a duration between 0 and 4 hours prior to performing the "lift-off" process.

Upper surface 59 of permanent magnet region 58 and upper surface 61 of permanent region 60 should be approximately the same height above substrate 120 or MR element 52 as surface 57 of SAL 56. If surfaces 57, 59 and 61 are at similar heights above substrate 120, surface 72 of MR sensor 50 will be substantially planar, and therefore well adapted for fabrication of an inductive write head on top of MR sensor 50. Differences in height between surfaces 57, 59 and 61 should preferably not exceed 500 ↑.

FIG. 8 illustrates MR sensor 50 after conductors 108 and 110 have been deposited. Because permanent magnet regions 58 and 60 define active region 66, conductors 108 and 110 can be deposited on permanent magnet regions 58 and 60 away from active region 67 and gap region 67. Conductors 108 and 110 can be deposited in positions which are on the air bearing surface but which are retracted from the active and gap regions in directions parallel to the air bearing surface. Conductors 108 and 110 can also be moved back from the air bearing surface in a direction perpendicular to the air bearing surface. These options help to maintain substantially planar surface 72 on which the write head is to be fabricated.

Figure 9:
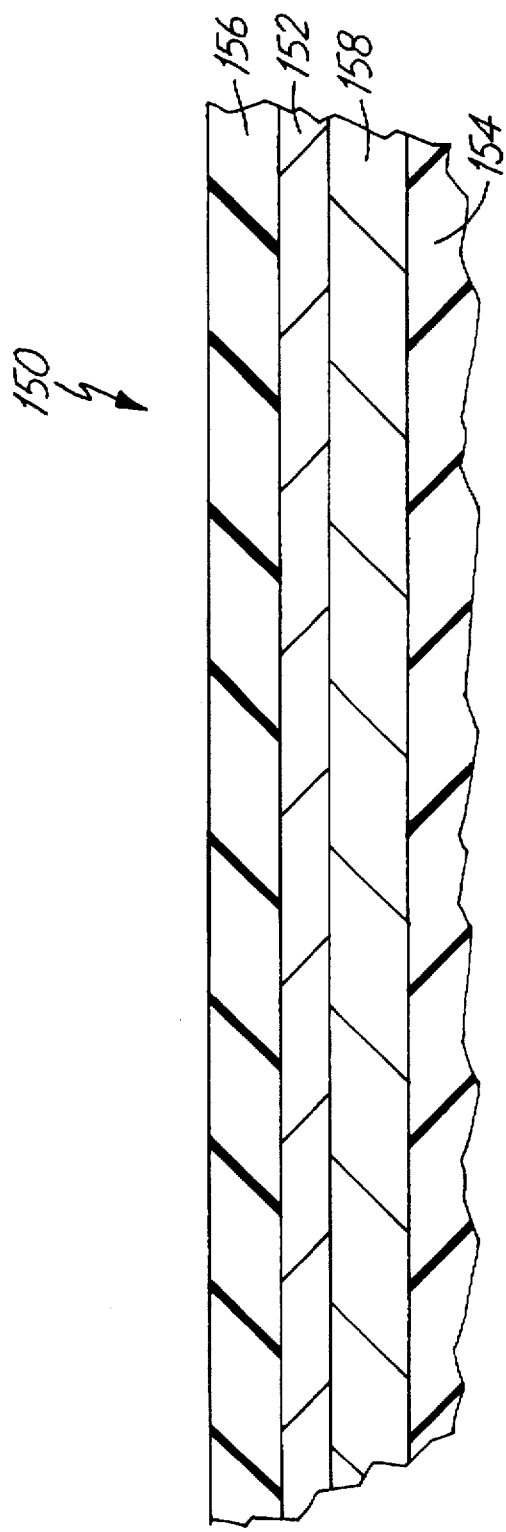
FIG. 9 is a sectional view of a bi-layer structure of the present invention.

FIG. 9 shows a bi-layer test structure 150 for characterizing exchange coupling. A permanent magnet layer 152 is deposited on a substrate 154. An MR layer 156 is deposited over the permanent magnet 152. The preferred permanent magnet 152 is Cobalt-Platinum deposited over a 3 inch round silicon wafer substrate 154. The preferred thickness of the MR layer 156 is 225 Angstroms. The preferred MR layer 156 is Nickel-Iron. The deposition parameters for the permanent magnet layer 152 and the MR layer 156 are preferably optimized for magnetic and magnetoresistive properties. If desired, a soft adjacent layer (SAL) 158 may be deposited between the substrate 154 and the permanent magnet layer 152. SAL 158 is made of a ferromagnetic material, such as a layer of nickel-iron-rhodium NiFeRh, nickel-iron-rhenium NiFeRe, or nickel-iron-chromium NiFeCr.

Deposition of the permanent magnet layer 152 and the MR layer 156 can be performed in a CVC cluster tool sputtering system. After depositing the permanent magnet layer 152, a sputter etching step may be added before deposition of the MR layer 156 to ensure an atomically clean interface.

Testing of the bi-layer structure 150 is performed by magnetizing the bi-layer structure 150 in a DC magnetic field sufficiently strong to saturate the permanent magnet layer 152. A magnetization curve is then determined for the bi-layer structure 150, by varying the strength of the applied magnetic field and measuring the resultant magnetism of the bi-layer structure 150 with a Magneto-Optic Kerr Effect Magnetometer (MOM). The laser beam from the MOM should only penetrate up to about the first 200 Angstroms of the bi-layer structure 150, slightly less than the preferred 225 Angstrom thickness of the MR layer 156. Since the laser beam from the MOM does not penetrate completely through the MR layer 156, it is believed that the measured magnetic moment signals picked up from the MOM are from the MR layer 156 alone. The resultant magnetism measurements were confirmed by a very large sample magnetometer (VLSM), and by magnetic force microscope (MFM). The microstructures of the films were examined by X-ray diffraction and atomic force microscope.

When the bi-layer test structure 150 is subject to an applied field both layers 152, 156 switch at least part of their domain magnetization resulting in a hysteresis loop of more complicated shape. Exchange coupling at the interface between the permanent magnet 152 and the MR layer 156 is characterized by a point of inflection on the hysteresis loop corresponding to that of the MR layer 156. The strength of the magnetic field given by this point of inflection, $H_{cr}$ is believed to correlate to a more fundamental quantity, the exchange constant. For purposes of selecting the fabrication parameters which give the greatest and most effective exchange coupling, measurement of field strength at the point of inflection, $H_{cr}$ is sufficient.

Workers skilled in the art will appreciate that the deposition of the MR layer 52 and the permanent magnet layer 58 are performed in the opposite order as compared to deposition of the permanent magnet layer 152 and the MR layer 156 of bi-layer structure 150. Reversal of the deposition order is necessary to ensure that the MOM results are measured from the MR layer 156 rather than from the permanent magnet layer 152. This reversal of deposition order is not believed to change the comparative validity of the test results. That is, while the value of the point of inflection $H_{cr}$ in the bi-layer structure 150 may not be accurate as compared to the quantity of exchange coupling occurring in the MR sensor 50, comparison between the point of inflection $H_{cr}$ of bi-layer structures 150 of different deposition parameters is believed to effectively characterize the exchange coupling differences between MR sensors 50 fabricated with those deposition parameters.

Workers skilled in the art will appreciate that the present invention is quite suitable for use with an MR sensor design in which the MR layer is deposited over the permanent magnet layer. For the most useful test results, it is desired to have the bi-layer structure 150 fabricated in accordance (same substrate, same order of deposition, etc.) with the design of the MR sensor which is being characterized.

EXAMPLES

Figure 10:
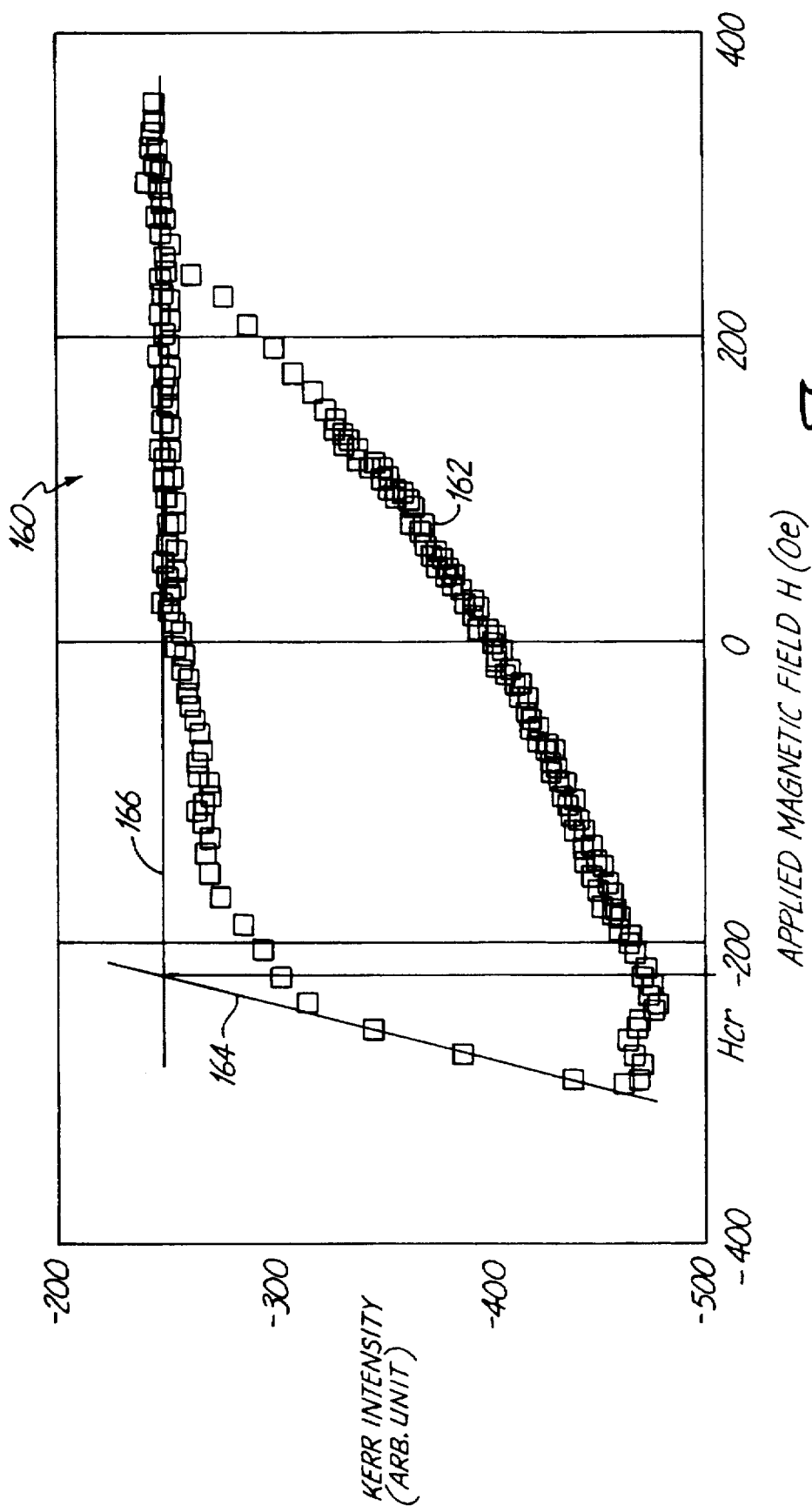
FIG. 10 is a magnetization curve for a bi-layer structure of the present invention.

FIG. 10 shows a typical hysteresis or magnetization curve 160 of the bi-layer structure 150 as measured by MOM after being saturated in a large DC field. The sheared shape of the bottom portion 162 of the curve 160 shows that the MR layer 156 is more difficult to saturate in one direction than in the opposite direction, which in turn indicates that an exchange coupling field exists between the permanent magnet 152 and the MR layer 156.

The strength of the exchange coupling is characterized by the strength of the magnetic field at the point of inflection, $H_{cr}$. The point of inflection $H_{cr}$ is determined by projecting out the slope 164 of the magnetic domain reversal portion of the magnetization curve 160, and selecting the absolute value of the magnetic field at intersection with saturation magnetization 166. In the example of FIG. 10, the bi-layer structure 150 has a saturation magnetization of about −245 (arbitrary Kerr Intensity units). The slope 164 of the magnetic domain reversal portion of the magnetization curve 160 intersects this value at a point of inflection $H_{cr}$ of absolute value of about 220 Oersteds.

Figure 11:
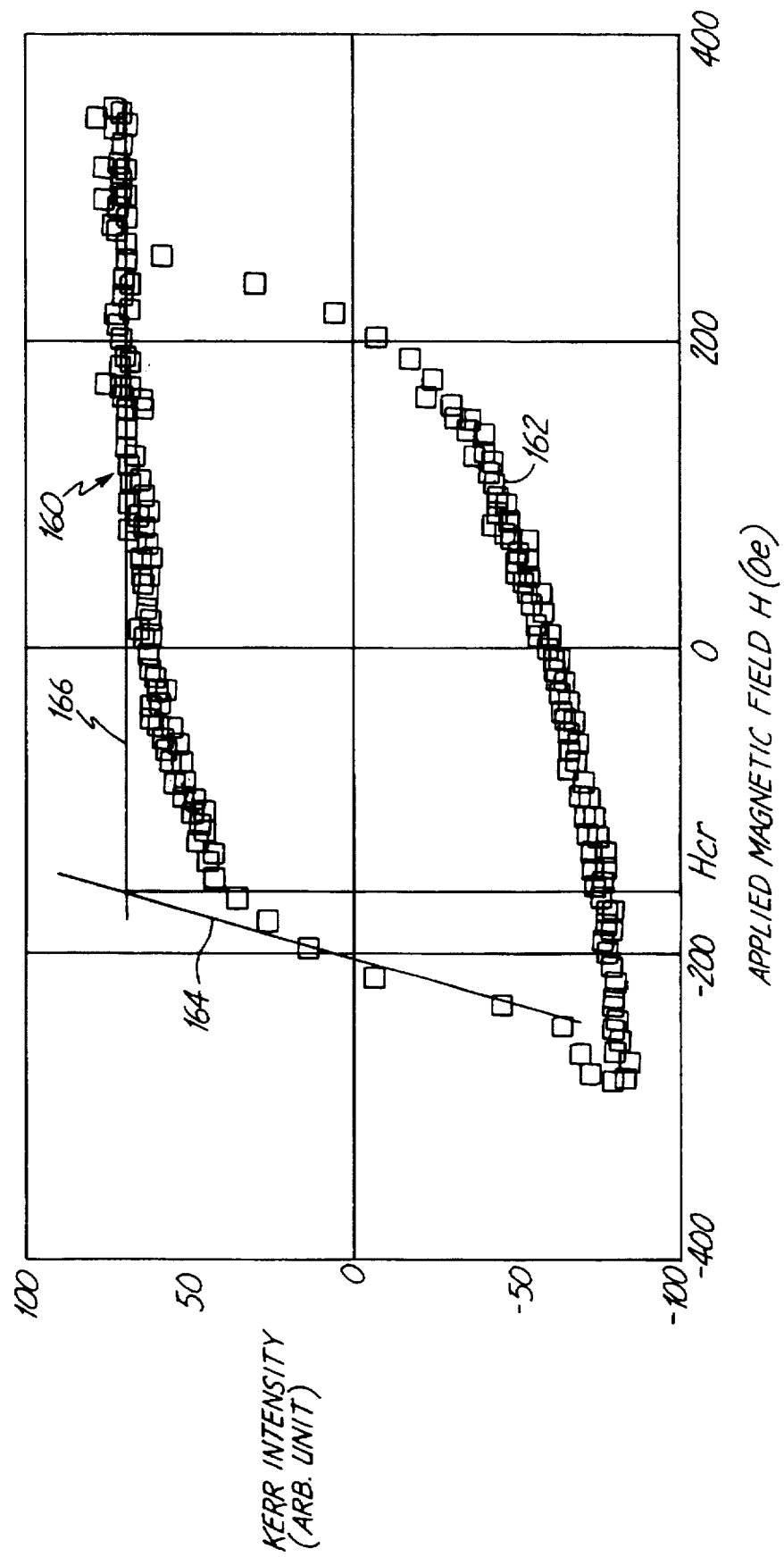
FIG. 11 is a magnetization curve for a bi-layer structure of the present invention.

FIG. 11 shows a typical hysteresis or magnetization curve 160 of a second bi-layer structure 150 as measured by MOM after being saturated in a large DC field. The point of inflection $H_{cr}$ for the second bi-layer structure 150 is characterized as 160 Oersteds, indicating a weaker coupling field compared with the first bi-layer structure 150.

Three series of bi-layer films 150 were deposited and characterized. The first series had different thicknesses of permanent magnet 152, ranging from 250 to 750 Angstroms. The second series had different etching time before deposition of the MR layer 156, from no etching to 4 minutes of etching. The third series of films 150 were annealed under 140° C. for different periods of time, from no anneal to 4 hours of anneal.

Figure 12:
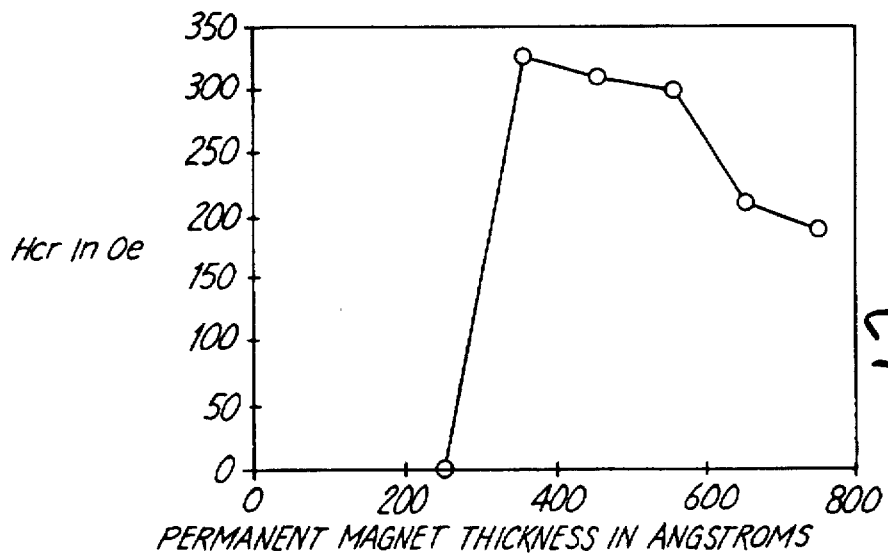
FIG. 12 is a plot of the strength of the exchange coupling as a function of the differing thicknesses of permanent magnet.

The effect of the differing thicknesses of permanent magnet 152 on the strength of the exchange coupling is plotted in FIG. 12. No exchange coupling was observed for a bi-layer film 150 with a thickness of permanent magnet 152 of 250 Angstroms. One possible explanation for this result might be that the permanent magnet 152 does not have a well defined crystal structure at 250 Angstroms, which was confirmed by AFM and X-ray diffraction data. The greatest exchange coupling occurred for a bi-layer film 150 with a thickness of permanent magnet 152 of 350 Angstroms. This peak is consistent with a maximum coercivity at this range of permanent magnet thickness. Exchange coupling monotonically decrease as the thickness of the permanent magnet layer 152 was increased from 350 Angstroms to 750 Angstroms. The decreasing of exchange field as the permanent magnet 152 becomes thicker might be attributed to differences in interfacial conditions, grain structures as well as interfacial roughnesses. The decreasing exchange coupling strength is also in agreement with the fact that the squareness of the hysteresis curve and the remanent magnetization decrease with increasing thickness of permanent magnet layer 152, which in turn indicates that the demagnetization field forces the easy axis of magnetization for the permanent magnet layer 152 to align in the plane of a very thin film.

Figure 13:
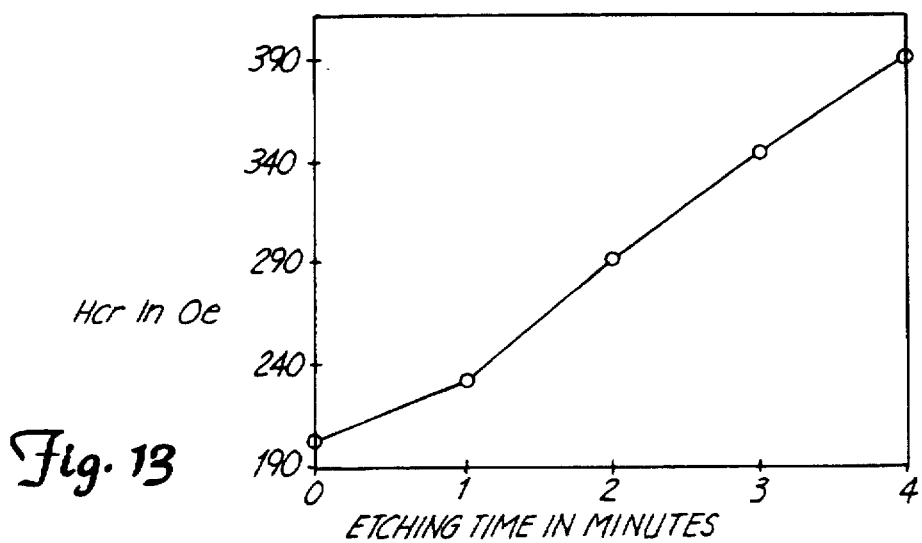
FIG. 13 is a plot of the strength of the exchange coupling as a function of the differing sputter etching times before deposition of the MR layer.

The effect of sputter etching times before deposition of the MR layer 156 is plotted in FIG. 13. For these tests, the thickness of the permanent magnet 152 was kept at 500 Angstroms. The exchange coupling field increases monotonically as the etching time increases. Possible reasons for this trend include different interface conditions, interfacial roughnesses and heat treatments experienced by each film associated with the sputter etching process.

Figure 14:
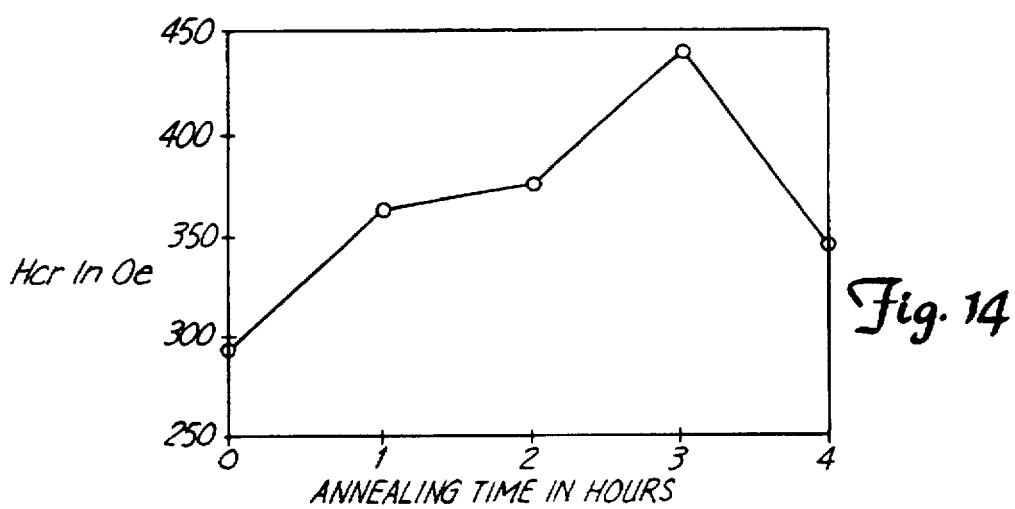
FIG. 14 is a plot of the strength of the exchange coupling as a function of the differing annealing times.

The effect of annealing times on exchange coupling is plotted in FIG. 14. The lowest exchange coupling occurred in the sample which was not annealed. As the annealing time increases to 3 hours, the effective exchange coupling field increases. As the annealing time approaches 4 hours, the effective exchange coupling field starts to drop. This implies that the exchange coupling in the bi-layer structure 150 is enhanced by initial interfacial diffusion, but that excessive interfacial mixing tends to diminish the amount of exchange coupling. In the fully annealed structure 150, hysteresis loops measured by VLSM at different direction relative to the easy axis of the permanent magnet layer 152 showed no switching process for the bi-layer film 150 up to 100 Oersted drive field. This indicates that the two layers 152, 156 in the fully annealed structure 150 are completely coupled together and behave like a single layer at this level of magnetic field.

Workers skilled in the art will appreciate that any other fabrication parameters may be modified in the bi-layer structure 150 to forecast the effect that a similar modification in an MR sensor 50 will have on the exchange coupling between the first and second outer regions 62, 64 and first and second permanent magnets 58, 60. For instance, changing the thickness of the MR layer 156 is likely to effect the measured exchange coupling. Similarly, the material of the MR layer 156, the material of the permanent magnet layer 152, the deposition parameters for the fabrication of bi-layer structure 150, the temperature of annealing, and similar fabrication parameters may all effect the exchanged coupling produced.

These test results show that the amount of exchange coupling can be varied by changing one or more fabrication parameters of the bi-layer structure 150. It is similarly believed that the amount of exchange coupling between first and second outer regions 62, 64 and first and second permanent magnets 58, 60 can be varied by changing similarly changing one or more fabrication parameters of the MR sensor 50. Optimization of the exchange coupling field will lead to increases in signal amplitudes in MR heads, while still maintaining a stable device operation with minimal Barkhausen noise.

Although the present invention has been described with reference to preferred embodiments, workers skilled in the art will recognize that changes may be made in form and detail without departing from the spirit and scope of the invention. For instance, workers skilled in the art will appreciate that the present invention and the test results from use of the present invention are applicable to a wide variety of MR head designs other than the particular preferred MR sensor 50 described with reference to drawings disclosed herein.

What is claimed is:

1. A method of selecting a thickness of a layer for use in a magnetic device, the magnetic device having a magnetoresistive layer with a first outer region, a second outer region and a central region located between the first and second outer regions, the magnetic device also having a permanent magnet layer which at least partially defines an active region of the magnetic device, the active region including the central region of the magnetoresistive layer, the permanent magnet layer having a first permanent magnet region formed in contact with the first magnetoresistive layer outer region and defining a first boundary of the active region, and a second permanent magnet region formed in contact with the second magnetoresistive layer outer region and defining a second boundary of the active region such that the active region is positioned at least partially between the first and second permanent magnet regions, the method comprising the steps of:

depositing a permanent magnet layer on a substrate;

depositing a magnetoresistive layer on the permanent magnet layer to form a bi-layer structure;

applying a DC magnetic field to the bi-layer structure;

during application of the DC magnetic field, measuring the magnetism of the magnetoresistive layer to determine a hysteresis loop of the magnetoresistive layer; and determining a point of inflection on the hysteresis loop.

2. The method of claim 1, further comprising the steps of:

forming a plurality of bi-layer structures each having a different thickness of the permanent magnet layer; and determining the point of inflection on the hysteresis loop for each of the plurality of bi-layer structures.

3. The method of claim 2, further comprising the steps of:

selecting the bi-layer structure with the point of inflection of highest coercivity; and fabricating the magnetic device with the thickness of the permanent magnet layer of the selected bi-layer structure.

4. The method of claim 1, further comprising the steps of:

forming a plurality of bi-layer structures each having a different thickness of the magnetoresistive layer; and determining the point of inflection on the hysteresis loop for each of the plurality of bi-layer structures.

5. The method of claim 4, further comprising the steps of:

selecting the bi-layer structure with the point of inflection of highest coercivity; and fabricating the magnetic device with the thickness of the magnetoresistive layer of the selected bi-layer structure.

6. The method of claim 1, further comprising the steps of:

forming a plurality of bi-layer structures each having a different ratio of thickness of the magnetoresistive layer to thickness of the permanent magnet layer; and determining the point of inflection on the hysteresis loop for each of the plurality of bi-layer structures.

7. The method of claim 6, further comprising the steps of:

selecting the bi-layer structure with the point of inflection of highest coercivity; and fabricating the magnetic device with the ratio of thickness of the magnetoresistive layer to the thickness of the permanent magnet layer of the selected bi-layer structure.

8. The method of claim 1, further comprising the step of depositing a soft adjacent layer on the substrate prior to deposition of the permanent magnet layer.

9. The method of claim 1, wherein the step of measuring the magnetism of the magnetoresistive layer is performed with a magneto-optic magnetometer.

10. A method of forming a magnetoresistive sensor comprising:

depositing a permanent magnet layer on a substrate;

depositing a magnetoresistive layer on the permanent magnet layer to form a bi-layer structure;

applying a DC magnetic field to the bi-layer structure;

during application of the DC magnetic field, measuring the magnetism of the magnetoresistive layer to determine a hysteresis loop of the magnetoresistive layer;

determining a point of inflection on the hysteresis loop;

selecting a fabrication parameter based on the point of inflection; and fabricating a magnetoresistive sensor using the selected fabrication parameter.

11. The method of claim 10, wherein the fabricating step further comprises:

depositing a second magnetoresistive layer upon a second substrate;

depositing a spacer layer upon the second magnetoresistive layer;

depositing a soft adjacent layer upon the spacer layer;

depositing a photoresist layer upon a central region of the soft adjacent layer, the photoresist layer defining a central region in each of the soft adjacent layer, the spacer layer, and the second magnetoresistive layer, the photoresist layer also at least partially defining first and second outer regions in each of the soft adjacent layer, the spacer layer, and the second magnetoresistive layer;

removing the first and second outer regions in each of the soft adjacent layer and the spacer layer;

depositing permanent magnet material upon the first and second outer regions of the second magnetoresistive layer and upon the photoresist layer, the permanent magnet material deposited upon the first and second outer regions of the second magnetoresistive layer forming first and second permanent magnets; and removing the photoresist layer and thereby removing the permanent magnet material deposited upon the photoresist layer, the permanent magnets remaining on the first and second outer regions of the second magnetoresistive layer each having a surface which is essentially coplanar with a surface of the soft adjacent layer.

12. The method of claim 11, wherein the fabrication parameter is the thickness of the permanent magnet layer.

13. The method of claim 11, wherein the fabrication parameter is the ratio of thickness of the magnetoresistive layer to thickness of the permanent magnet layer.

14. The method of claim 1, further comprising the steps of:

annealing the bi-layer structure; and annealing the first and second permanent magnets on the second magnetoresistive layer.

15. The method of claim 14 wherein the fabrication parameter is a duration of annealing.

16. The method of claim 14, wherein the fabrication parameter is a temperature of annealing.

17. The method of claim 11, further comprising the steps of:

etching the permanent magnet layer prior to deposition of the magnetoresistive layer; and etching the first and second outer regions of the second magnetoresistive layer prior to depositing permanent magnet material thereon; and wherein the fabrication parameter is a duration of etching.

18. The method of claim 11, wherein the magnetoresistive layer is a layer of Permalloy.

19. The method of claim 11, wherein the step of measuring the magnetism of the magnetoresistive layer is performed with a magneto-optic magnetometer.

20. The method of claim 10, further comprising the step of:

depositing a soft adjacent layer on the substrate prior to deposition of the permanent magnet layer.

21. The method of claim 1, wherein the magnetoresistive layer is a layer of Permalloy.

* * * * *

UNITED STATES PATENT AND TRADEMARK OFFICE
CERTIFICATE OF CORRECTION

PATENT NO. : 5,776,537
DATED : JULY 7, 1998
INVENTOR(S) : PATRICK J. RYAN ET AL.

It is certified that error appears in the above-identified patent and that said Letters Patent is hereby corrected as shown below:

Col. 12, line 33, delete "1", insert --11--

Signed and Sealed this

Twenty-first Day of September, 1999

Attest:

Q. TODD DICKINSON

*Attesting Officer*  *Acting Commissioner of Patents and Trademarks*